(12) United States Patent
Baniecki et al.

(45) Date of Patent: Oct. 12, 2004
(10) Patent No.: US 6,803,617 B2

(54) CAPACITOR AND METHOD FOR FABRICATING THE SAME

(75) Inventors: John David Baniecki, Kawasaki (JP); Takeshi Shioga, Kawasaki (JP); Kazuaki Kurihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/340,713

(22) Filed: Jan. 13, 2003

(65) Prior Publication Data

US 2003/0136998 A1 Jul. 24, 2003

(30) Foreign Application Priority Data

Jan. 15, 2002 (JP) ........................................ 2002-006323

(51) Int. Cl.⁷ ............................................... H01G 7/06
(52) U.S. Cl. ..................... 257/295; 257/296; 257/298
(58) Field of Search ................................ 257/295–310

(56) References Cited

U.S. PATENT DOCUMENTS

| 6,172,385 B1 | 1/2001 | Duncombe et al. ......... 257/295 |
| 6,327,172 B1 * | 12/2001 | Ishiwara ..................... 365/145 |
| 2003/0094640 A1 * | 5/2003 | Ohtsuka et al. ............. 257/295 |

FOREIGN PATENT DOCUMENTS

JP 11-220106 8/1999

* cited by examiner

*Primary Examiner*—H. Jey Tsai
(74) *Attorney, Agent, or Firm*—Westerman, Hattori, Daniels & Adrian, LLP

(57) ABSTRACT

The capacitor comprises an lower electrode 22, a dielectric film 30 formed on the lower electrode 22, a floating electrode 20 formed on the dielectric film 30, a dielectric film 50 formed on the floating electrode 40 and having a film orientation different from that of the dielectric film 30, and an upper electrode 80 formed on the dielectric film 50, whereby various characteristics depending on film orientations of the dielectric films can be simultaneously improved.

13 Claims, 7 Drawing Sheets

CAPACITOR AND METHOD FOR FABRICATING THE SAME

CROSS-REFERENCE TO RELATED APPLICATIONS

This application is based upon and claims the benefit of priority from the prior Japanese Patent Application No. 2002-6323, filed in Jan. 15, 2002, the entire contents of which are incorporated herein by reference.

BACKGROUND OF THE INVENTION

The present invention relates to a capacitor and a method for fabricating the same, more specifically to a capacitor using a high dielectric constant film or a ferroelectric film as the capacitor dielectric film, and a method for fabricating the same.

Capacitors are used in various applications of the field of electronic devices, such as decoupling capacitors for suppressing voltage noises and voltages fluctuations generated across power bus lines, as storage capacitors in semiconductor devices, such as DRAMs, FeRAMs, etc., and as active tunable elements in microwave device application, etc.

As the dielectric films of the capacitors used in these applications, various dielectric materials are proposed, and high dielectric constant and ferroelectric materials of perovskite-type oxides and compounds containing a pyrochlore structure are also studied.

Here, it is known that the film orientation of perovskite-type oxide and of compounds containing a pyrochlore structure as the dielectric, profoundly impacts the electrical properties of the capacitor.

For example, as for BST (BaSrTiO$_x$: barium strontium titanate) film, the (100) oriented film can have high voltage dependency of the capacitance value. Accordingly, in a case that BST film is used in voltage tunable applications, etc., it is preferable that the (100) oriented film is used. However, the (100) oriented film has high interface state density in the interface with platinum (Pt) used as an electrode material. Accordingly, electrons tend to be trapped in the electrode interface, and the leakage current in strong electric fields has high time dependency unsuitably to be used in applications requiring the characteristic to be stable for a long period of time.

On the other hand, as for BST film formed by MOCVD, the (110) oriented film has the interface state density in the Pt/BST interface lower than the (100) oriented film. By using the (110) oriented film, the time dependent leakage current can be suppressed or precluded. Thus, it is preferable that the (110) oriented film formed by MOCVD is used in applications required the characteristic to be stable for a long period of time.

Capacitors using dielectric films having perovskite structure and pyrochlore structure have the electric characteristics are degraded by the exposure to hydrogen ambient. In this case as well, the film orientation dependency of the dielectric films are found. That is, when the (100) oriented films are subjected to, e.g., forming gas annealing for improving characteristics of transistors after the capacitors have been formed, the electric characteristics are much affected, such as the leakage current being increased, the capacitance value being decreased, etc. (111) oriented films and (110) oriented films, however, can suppress such electric characteristics degradation. This will be because the (100) oriented film has fine structure and grain boundaries extended perpendicular to the surfaces of the film, whereby hydrogen more tends to diffuse in the film in comparison with the (111) oriented film and the (110) oriented film.

As described above, dielectric films having perovskite structure and pyrochlore structure are strongly dependent on orientation of the films. Accordingly, when capacitors are formed of such dielectric films, it is preferable to select orientations of the films in accordance with applications in which the films are to be used.

As described above, dielectric films having perovskite structure and pyrochlore structure have the characteristics highly dependent on orientations of the films. When one film orientation is selected so as to optimize one characteristic (e.g., voltage tunability of the capacitance value), it cannot help sacrificing another characteristic (e.g., leakage current characteristic).

A capacitor which is characterized optimum for one application must have the characteristics improved in other viewpoint so as to further improve device characteristics. Accordingly, a capacitor which permits various characteristics provided by the respective film orientation of the dielectric film to be concurrently improved has been required.

SUMMARY OF THE INVENTION

An object of the present invention is to provide a capacitor which can concurrently improve various characteristics dependent on film orientations of the dielectric films, and a method for fabricating the same.

According to one aspect of the present invention, there is provided a capacitor comprising; a lower electrode; a capacitor dielectric film formed on the lower electrode and including at least two dielectric films whose film orientations are different from each other and which are spaced from each other by a floating electrode; and an upper electrode formed on the capacitor dielectric film.

According to another aspect of the present invention, there is provided a capacitor comprising: a lower electrode; a first dielectric film formed on the lower electrode; a first floating electrode formed on the first dielectric film; a second dielectric film formed on the first floating electrode and having a film orientation different from that of the first dielectric film; and an upper electrode formed on the second dielectric film.

In the above-described capacitor it is possible that the capacitor further comprises a second floating electrode formed on the second dielectric film; and a third dielectric film formed on the second floating electrode and having a film orientation different from that of the second dielectric film.

According to further another aspect of the present invention, there is provided a capacitor comprising: a lower electrode; a first dielectric film formed on the lower electrode; a floating electrode formed on the first dielectric film; a second dielectric film formed on the floating electrode and formed of a dielectric material different from that of the first dielectric film; and an upper electrode formed on the second dielectric film.

According to further another aspect of the present invention, there is provided a method for fabricating a capacitor comprising the steps of: forming a first dielectric film on a lower electrode; forming a first floating electrode on the first dielectric film; forming on the first floating electrode a second dielectric film having a film orientation different from that of the first dielectric film; and forming an upper electrode on the second dielectric film.

In the above-described method for fabricating the capacitor it is possible that the method further comprises, after the step of forming the second dielectric film, the steps of: forming a second floating electrode on the second dielectric film; forming on the second floating electrode a third dielectric film having a film orientation different from that of the second dielectric film.

As described above, in the capacitor according to the present invention including the capacitor dielectric film of high dielectric constant film or ferroelectric film, the capacitor dielectric film is formed of at least 2 dielectric films having film orientations different from each other, whereby various characteristics which have dependency on film orientations of the dielectric films can be simultaneously improved.

DETAILED DESCRIPTION OF THE INVENTION

A First Embodiment

The capacitor and the method for fabricating the same according to a first embodiment of the present invention will be explained with reference to FIG. 1 and FIGS. 2A–2C.

Figure 1:
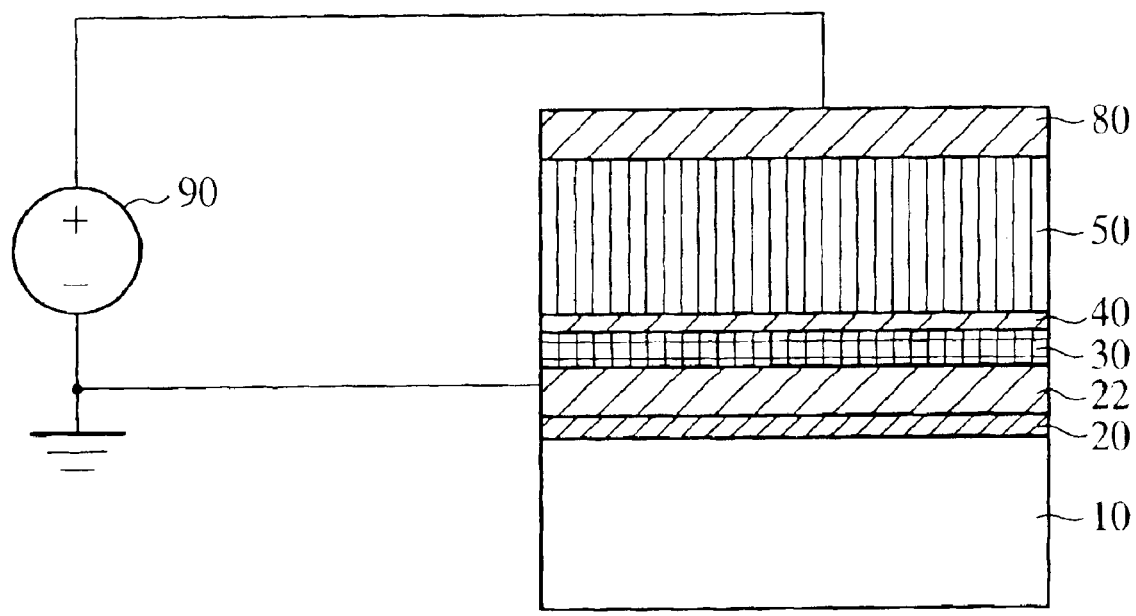
FIG. 1 is a diagrammatic sectional view of the capacitor according to a first embodiment of the present invention, which shows a structure thereof.
Figure 2A:
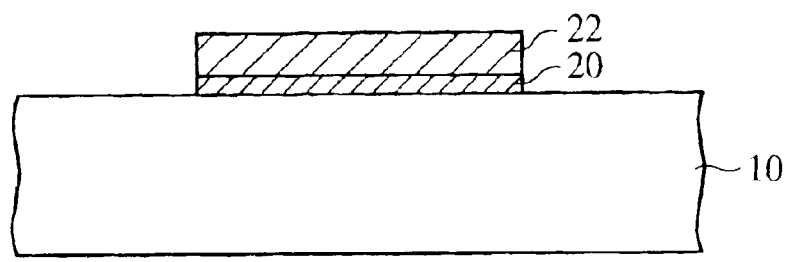
FIGS. 2A–2C are sectional views of the capacitor according to the first embodiment of the present invention in the steps of the method for fabricating the same, which show the method.
Figure 2B:
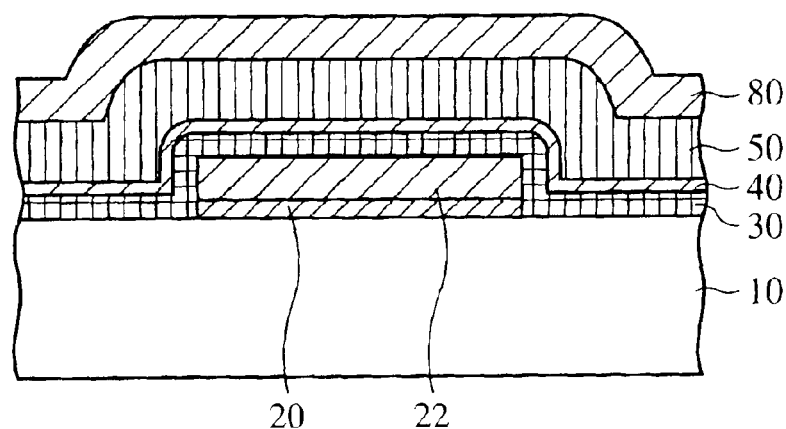
Figure 2C:
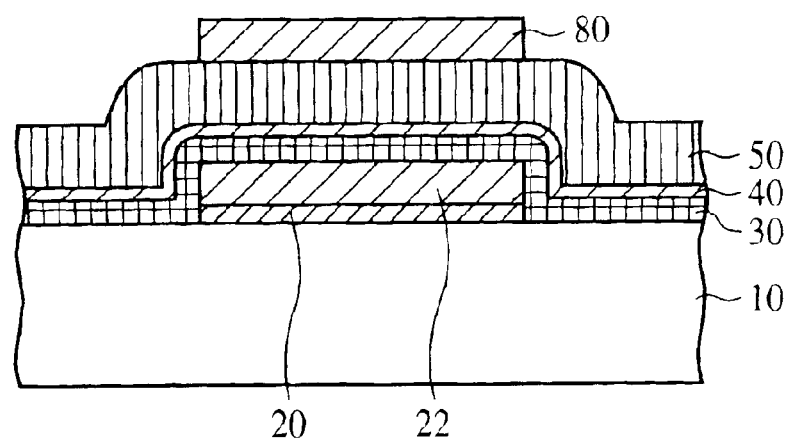

FIG. 1 is a diagrammatic sectional view of the capacitor according to the present embodiment, which shows the structure thereof. FIGS. 2A–2C are sectional views of the capacitor according to the present embodiment in the steps of the method for fabricating the same, which show the method.

First, the structure of the capacitor according to the present embodiment will be explained with reference to FIG. 1.

An adhesion layer 20 of, e.g., titanium oxide ($TiO_2$) film is formed on a substrate 10. A lower electrode 22 of, e.g., platinum (Pt) film is formed on the adhesion layer 20. A BST film 30 having (100) oriented grain boundary and (110) oriented grain boundary (hereinafter called a (110) (100) BST film) is formed on the lower electrode 22. A floating electrode 40 of, e.g., platinum film is formed on the (110) (100) BST film 30. A BST film 50 having (100) orientation (hereinafter called a (100) BST film) is formed on the floating electrode 40. An upper electrode 80 of, e.g., platinum film is formed on the (100) BST film 50.

The capacitor according to the present embodiment is characterized mainly in that, as described above, the capacitor includes the (110) (100) BST film 30 and the (100) BST film 50, and that the floating electrode 40 is formed between the (110) (100) BST film 30 and the (100) BST film 50. Here, the floating electrode 40 is not electrically connected to the lower electrode 22, the upper electrode 80 and the other electrodes. That is, the capacitor constituted by the lower electrode 22, the (110) (100) BST film and the floating electrode 40, and the capacitor constituted by the floating electrode 40, the (100) BST film 50 and the upper electrode 80 are serially connected with each other. The capacitors having such structure are equivalent to a capacitor including a capacitor dielectric film of the layer of the (110) (100) BST film 30 and the (100) BST film 50 between the lower electrode 22 and the upper electrode 80.

The (110) (100) BST film has a lower interface state density (trap density) in the Pt-BST interface than the (100) BST film, and electrons are injected more effectively to improve the leakage characteristic from the side where the (110) (100) BST film is formed. Accordingly, the capacitor according to the present embodiment is very effective to be used in a mode where as shown in FIG. 1, the terminal of the higher potential side of a power source 90 is connected to the side of the upper electrode 80, and the terminal of the lower potential side of the power source 90 is connected to the side of the lower electrode 22, and the switching is not performed, e.g., as a decoupling capacitor for suppressing voltage noises and voltage fluctuations generated across power bus lines.

The capacitor is thus structured to thereby improve the voltage dependency of the capacitance value by the (100) BST film 50, and the leakage current characteristic can be improved by the (110) (100) BST film 30. Thus, advantages provided by using as the capacitor dielectric film the (100) oriented film and the (110) (100) oriented film can be simultaneously provided.

Next, the method for fabricating the capacitor according to the present embodiment will be explained with reference FIGS. 2A–2C.

First, a 20 nm-thick titanium oxide film, for example, is deposited on a substrate 10 by, e.g., RF magnetron sputtering method to form the adhesion layer 20 of the titanium oxide film on the substrate 10. The substrate 10 can be a semiconductor substrate as of silicon, or a semiconductor substrate with an insulating film, such as a silicon oxide film or others, formed on. Otherwise, the substrate 10 can have elements, such as transistors, etc., formed on. The substrate 10 is not essentially formed of a semiconductor substrate.

Next, a 100 nm-thick platinum film, for example is deposited on the adhesion layer 20 by, e.g., RF magnetron sputtering method. Thus, the lower electrode 22 of the platinum film is formed on the adhesion layer 20.

Then, the lower electrode 22 and the adhesion layer 20 are patterned in a prescribed configuration by photolithography and ion milling (FIG. 2A).

Next, the (110) (100) BST film 30 of, e.g., a 25 nm-thick is formed on the substrate 10 with the adhesion layer 20 and the lower electrode 22 formed on by, e.g., RF magnetron sputtering method. The (110) (100) BST film can be deposited, e.g., at a 500° C. substrate temperature, a 100 W RF power, at a 3/1 $Ar/O_2$ ratio and under a 30 mTorr pressure.

Then, a 100 nm-thick platinum film, for example is deposited on the (110) (100) BST film 30 by, e.g., RF magnetron sputtering method. Thus, the floating electrode 40 of the platinum film is formed on the (110) (100) BST film 30.

Next, the (100) BST film 50 of, e.g., a 100 nm-thick is formed on the floating electrode 40 by, e.g., RF magnetron sputtering method. The (100) oriented BST film can be deposited, e.g., at a 600° C. substrate temperature, a 100 W RF power, at a 30/1 Ar/$O_2$ ratio and under a 10 mTorr pressure.

Usually, a BST film deposited on a (110) (100) BST film under film forming conditions different from those for the (110) (100) BST film is a (110) (100) film reflecting the film orientation of the lower BST film. However, in the method for fabricating the capacitor according to the present embodiment, in which the floating electrode 40 of platinum film is formed on the (110) (100) BST film, a film orientation of the (100) BST film 50 can be controlled independently of the (110) (100) BST film 30.

Thus, a 125 nm-total thick capacitor dielectric film of the (110) (100) BST film 30 and the (100) BST film is formed.

Then, a 100 nm-thick platinum film, for example, is deposited on the (100) BST film 50 by, e.g., RF magnetron sputtering method. Thus, the upper electrode 80 of the platinum film is formed on the (100) BST film 50 (FIG. 2B).

Next, the upper electrode 80 is patterned in a prescribed configuration by photolithography and ion milling.

Thus, the capacitor including the capacitor dielectric film formed of the (110) (100) BST film 30 and the (100) BST film 50, and the floating electrode 40 formed between the (110) (100) BST film 30 and the (100) BST film 50 can be formed (FIG. 2C).

As described above, according to the present embodiment, the capacitor dielectric film is formed of the (110) (100) oriented film and the (100) oriented film, whereby the capacitor which can realize both the advantage provided by the (110) (100) oriented film and by the (100) oriented film can be formed.

In the present embodiment, the (110) (100) BST film is formed on the side of the lower electrode but may be formed on the side of the upper electrode.

A Second Embodiment

The capacitor and the method for fabricating the same according to a second embodiment of the present invention will be explained with reference to FIGS. 3 and 4. The same members of the present embodiment as those of the capacitor and the method for fabricating the same according to the first embodiment are represented by the same reference numbers not to repeat or to simplify their explanation.

Figure 3:
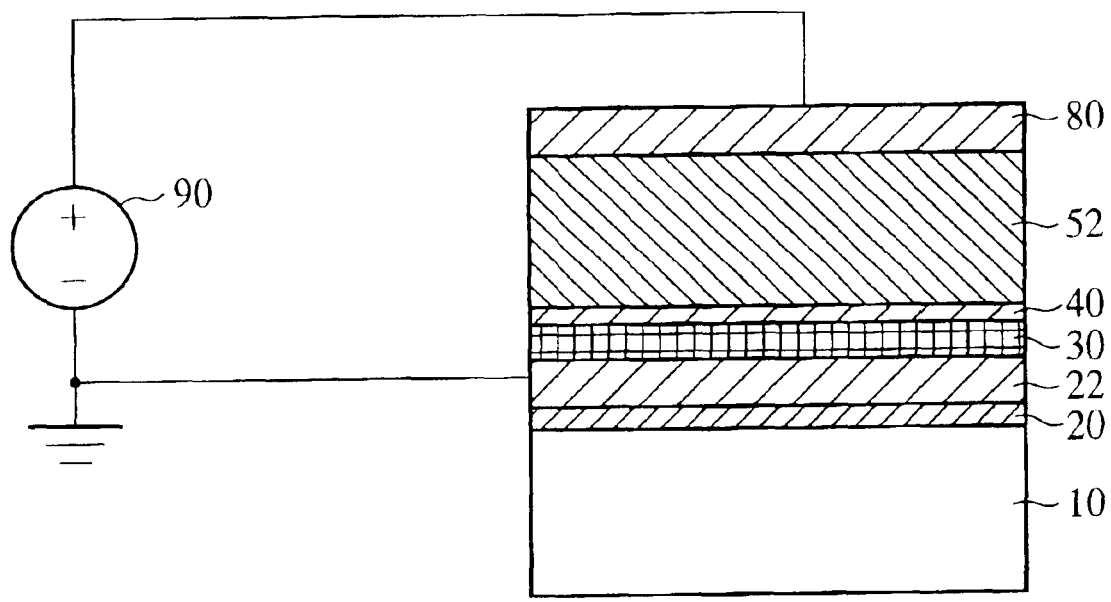
FIG. 3 is a diagrammatic view of the capacitor according to a second embodiment of the present invention, which shows a structure thereof.

FIG. 3 is a diagrammatic sectional view of the capacitor according to the present embodiment, which shows a structure thereof. FIG. 4 is a graph of leakage current characteristics of the capacitor according to the present embodiment and of the conventional capacitor.

The capacitor according to the present embodiment is the same in the basic structure as the capacitor according to the first embodiment shown in FIG. 1. The capacitor according to the present embodiment is characterized in that a (111) BST film 52 is formed in place of the (100) BST film 50.

The dielectric constant of (111) BST film is higher than that of (100) BST film. The capacitor includes the (111) BST film 52, whereby the storage capacitance can be higher. The (110) (100) BST film 30 can improve the leakage current characteristics. Thus, the advantage provided by using as the capacitor dielectric film the (111) film and the (110) (100) film can be simultaneously provided.

Figure 4:
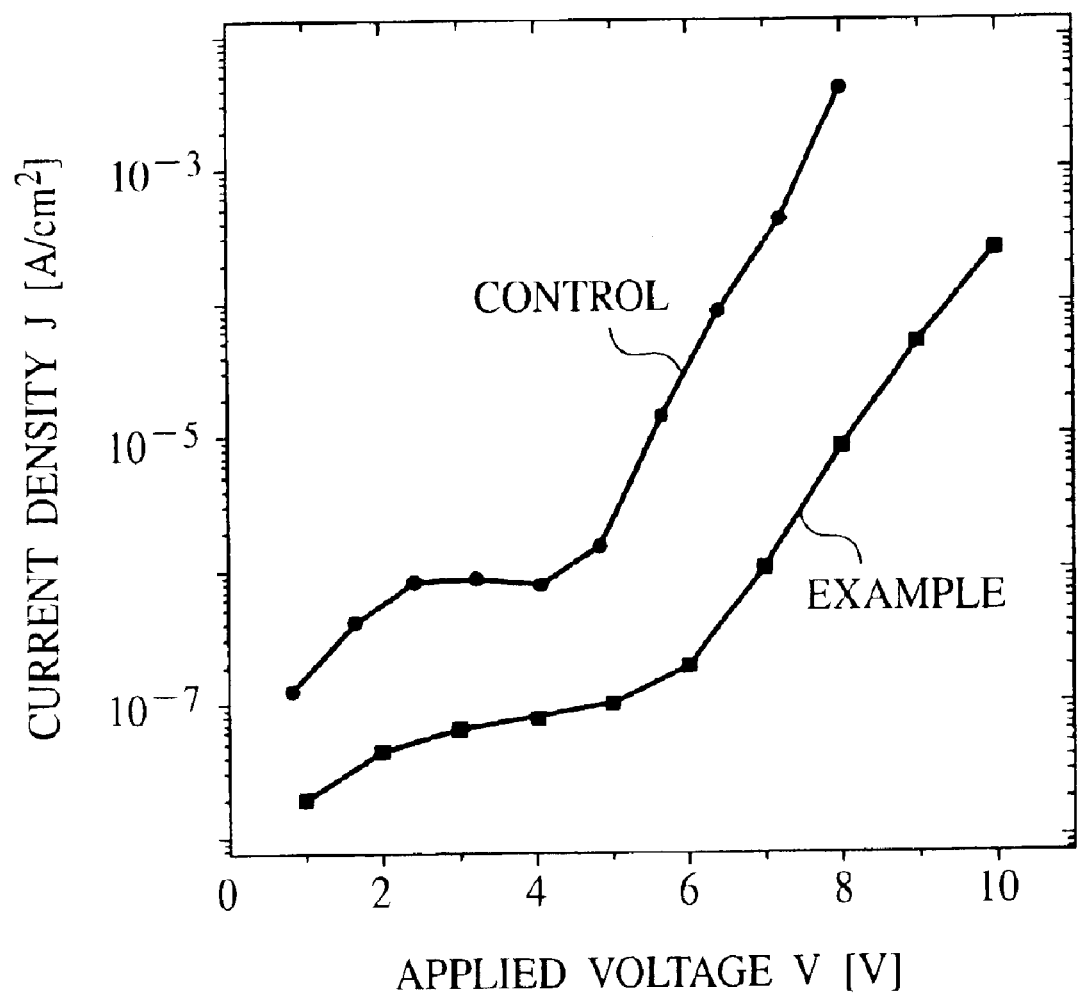
FIG. 4 is a graph of leakage current characteristics of the capacitor according to the second embodiment of the present invention and of the conventional capacitor.

FIG. 4 is a graph of leakage current characteristics of the capacitor according to the present embodiment including the 50 nm-thick (110) (100) BST film 30 and the 50 nm-thick (111) BST film 52 as the capacitor dielectric film (Example), and the capacitor using a single layer of the 100 nm-thick (111) BST film as the capacitor dielectric film (Control). As shown, the capacitor according to the present embodiment, the leakage current could be drastically decreased.

The method for fabricating the capacitor according to the present embodiment is the same as the method for fabricating the capacitor according to the first embodiment except that the (111) BST film 52 is formed in place of the (100) BST film 50.

The (111) BST film 52 of a (111) oriented polycrystalline BST film having a dielectric constant of about 400 can be formed by depositing by, e.g., RF magnetron sputtering method at a 600° C. substrate temperature, a 100 W RF power, a 30/3.7 Ar/$O_2$ ratio and a 10 mTorr pressure.

As described above, according to the present embodiment, the capacitor dielectric film is formed of (110) (100) film and (111) film, whereby the capacitor which can realize the advantage provided by the (110) (100) oriented film and the advantage provided by the (111) oriented film can be formed.

In the present embodiment, the (110) (100) BST film is disposed on the side of the lower electrode but may be disposed on the side of the upper electrode.

(100) (111) BST film may be used in place of the (110) (100) BST film. The (100) (111) BST film can be formed by depositing, when formed by RF magnetron sputtering, the BST film at a 500° C. substrate temperature, a 100 W RF power, a 30/3 Ar/$O_2$ ratio and a 10 mTorr pressure.

A Third Embodiment

The capacitor and the method for fabricating the same according to a third embodiment of the present invention will be explained with reference to FIGS. 5 and 6A–6B. The same members of the present embodiment as those of the capacitor and the method for fabricating the same according to the first and the second embodiments are represented by the same reference numbers not to repeat or to simplify their explanation.

Figure 5:
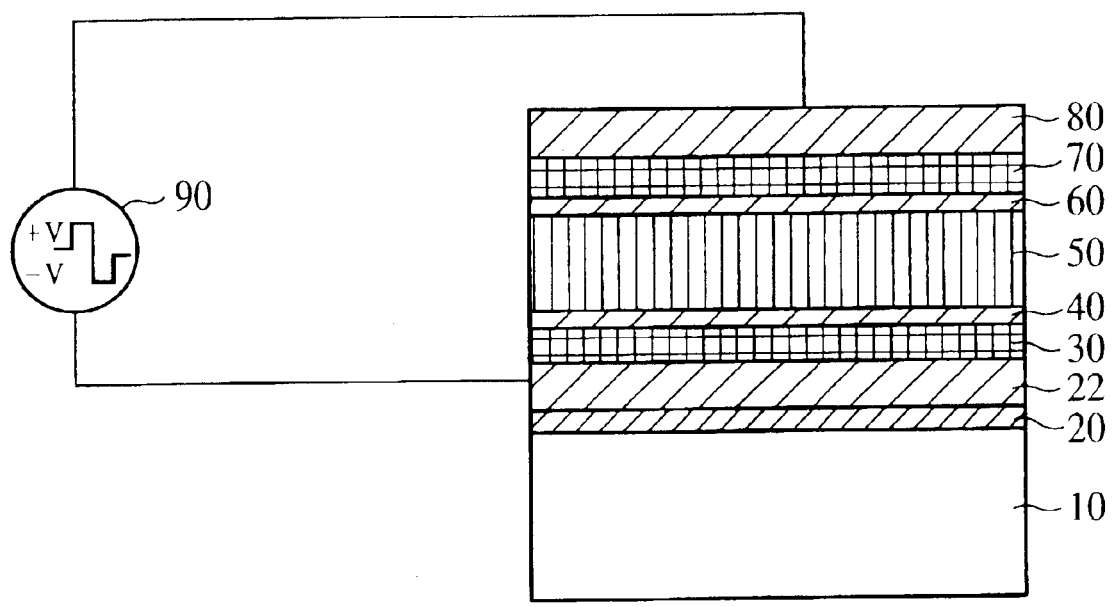
FIG. 5 is a diagrammatic sectional view of the capacitor according to a third embodiment of the present invention, which shows a structure thereof.
Figure 6A:
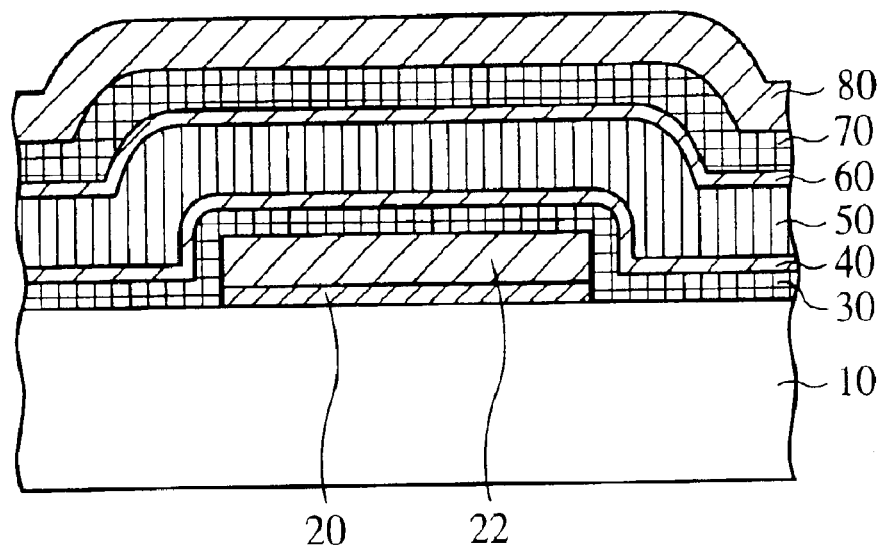
FIGS. 6A–6B are sectional views of the capacitor according to the third embodiment of the present invention in the steps of the method for fabricating the same, which show the method.

FIG. 5 is a diagrammatic sectional view of the capacitor according to the present embodiment, which shows the structure thereof. FIGS. 6A–6B are sectional views of the capacitor according to the present embodiment in the steps of the method for fabricating the same, which show the method.

First, the structure of the capacitor according to the present embodiment will be explained with reference to FIG. 5.

An adhesion layer 20 of, e.g., titanium oxide film is formed on a substrate 10. A lower electrode 22 of, e.g., platinum film is formed on the adhesion layer 20. A (110) (100) BST film 30 is formed on the lower electrode 22. A floating electrode 40 of, e.g., platinum film is formed on the (110) (100) BST film 30. A (100) BST film 50 is formed on the floating electrode 40. A floating electrode 60 of, e.g., platinum film is formed on the (100) BST film 50. A (110) (100) BST film 70 is formed on the floating electrode 60. An upper electrode 80 of, e.g., platinum film is formed on the BST film 70.

As described above, the capacitor according to the present embodiment is characterized in that the capacitor includes the (110) (100) BST film 30, the (100) BST film 50 and the (110) (100) BST film 70, the floating electrode 40 is formed between the (110) (100) BST film 30 and the (100) BST film 50, and the floating electrode 60 is formed between the (100) BST film 50 and the (110) (100) BST film 70. The floating electrodes 40, 60 are not electrically connected to the lower electrode 22 and the upper electrode 80 and the other electrodes. That is, the capacitor constituted by the lower electrode 22, the (110) (100) BST film 30 and the floating electrode 40, the capacitor constituted by the floating electrode 40, the (100) BST film 50 and the floating electrode 60, and the capacitor constituted by the floating electrode 60, the (110) (100) BST film 70 and the upper electrode 80 are serially connected with each other. The capacitor of this structure is equivalent to the capacitor including the (110) (100) BST film 30, the (100) BST film 50 and the (110) (100) BST film 70 laid between the lower electrode 22 and the upper electrode 80.

The capacitor according to the present embodiment includes the (110) (100) BST films the interface state density is low in the Pt/BST interface formed respectively in contact with the lower electrode 22 and the upper electrode 80, whereby the leakage characteristics can be improved even in the case that electrons are injected either from the lower electrode 22 or from the upper electrode 80. Thus, the capacitor according to the present embodiment can be used effectively in the mode where, as shown in FIG. 5, a power source 90 is connected between the lower electrode 22 and the upper electrode 80 for switching as capacitors of, e.g., DRAMs and FRAMs.

The capacitor having this structure can have high voltage dependency of the capacitance value by the (100) BST film 50 and can improve the leakage current characteristics by the (110) (100) BST films 30, 70, whereby the capacitor can simultaneously realize both the advantage provided by using as the capacitor dielectric film the (100) oriented film and the (110) (100) oriented film. The (110) (100) BST films are provided respectively on the side of the lower electrode 22 and on the side of the upper electrode 80, whereby the capacitor can be used very effectively in applications of A.C. drive.

Next, the method for fabricating the capacitor according to the present embodiment will be explained with reference to FIGS. 6A–6B.

First, in the same way as, e.g., in the method for fabricating the capacitor according to the first embodiment shown in FIGS. 2A and 2B, the adhesion layer 20, the lower electrode 22, the (110) (100) BST film 30, the floating electrode 40 and the (100) BST film 50 are formed on a substrate 10.

Then, a 100 nm-thick platinum film, for example, is deposited on the (100) BST film 50 by, e.g., RF magnetron sputtering method. Thus, the floating electrode 60 of the platinum film is formed on the (100) BST film 50.

Next, the (110) (100) BST film 70 of, e.g., a 25 nm-thick is formed on the floating electrode 60 by, e.g., RF magnetron sputtering method. The (110) (100) oriented film can be formed by depositing the BST film, e.g., at a 500° C. substrate temperature, a 100 W RF power, a 3/1 Ar/O$_2$ ratio and a 30 mTorr pressure.

Thus, the capacitor dielectric film of a 150 nm-total thick is formed of the (110) (100) BST film 30, the (100) BST film 50 and the (110) (100) BST film 70.

Next, a 100 nm-thick platinum film, for example, is deposited on the (110) (100) BST film 70 by, e.g., RF magnetron sputtering method. Thus, the upper electrode 80 of the platinum film is formed on the (110) (100) BST film (FIG. 6A).

Next, the upper electrode 80 is patterned in a prescribed configuration by photolithography and ion milling.

Figure 6B:
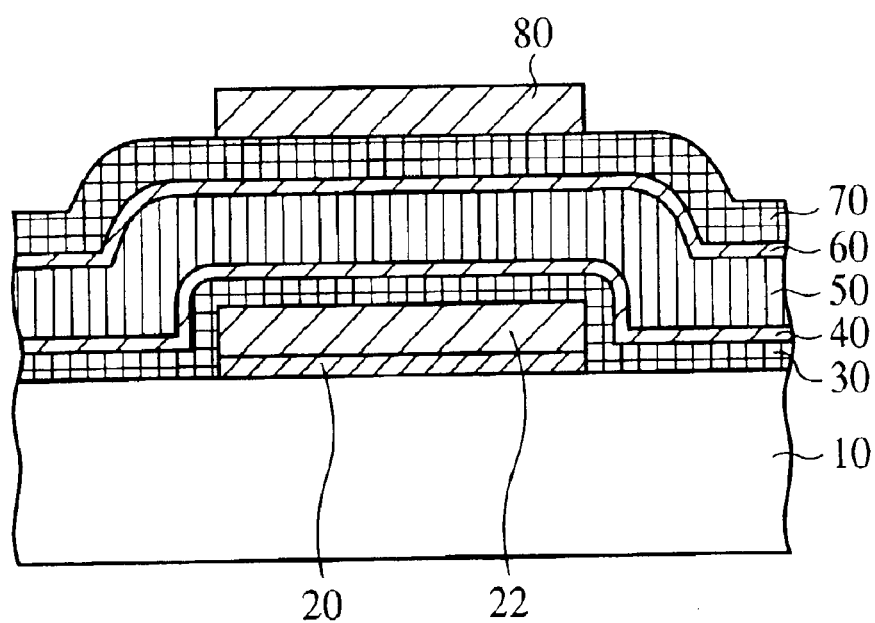

Thus, the capacitor including the capacitor dielectric film formed of the (110) (100) BST film 30, the (100) BST film 50 and the (110) (100) BST film 70, the floating electrode 40 formed between the (110) (100) BST film 30 and the BST (100) film 50, and the floating electrode 60 formed between the (100) BST film 50 and the (110) (100) BST film 70 can be fabricated (FIG. 6B).

As described above, according to the present embodiment, the capacitor dielectric film is formed of the (110) (100) oriented film and the (100) oriented film, whereby the capacitor which can realize both the advantage provided by using the (110) (100) oriented film and the advantage provided by using the (100) oriented film can be fabricated. The (110) (100) oriented films are respectively provided on the side of the lower electrode and the side of the upper electrode, whereby the influence of the electron injection from both electrodes can be precluded. Accordingly, the capacitor can be used very effectively in applications of A.C. drive.

A Fourth Embodiment

The capacitor and the method for fabricating the same according to a fourth embodiment of the present invention will be explained with reference to FIG. 7. The same members of the present embodiment as those of the capacitor and the method for fabricating the same according to the first to the third embodiments shown in FIGS. 1 to 6B are represented by the same reference numbers not to repeat or to simplify their explanation.

Figure 7:
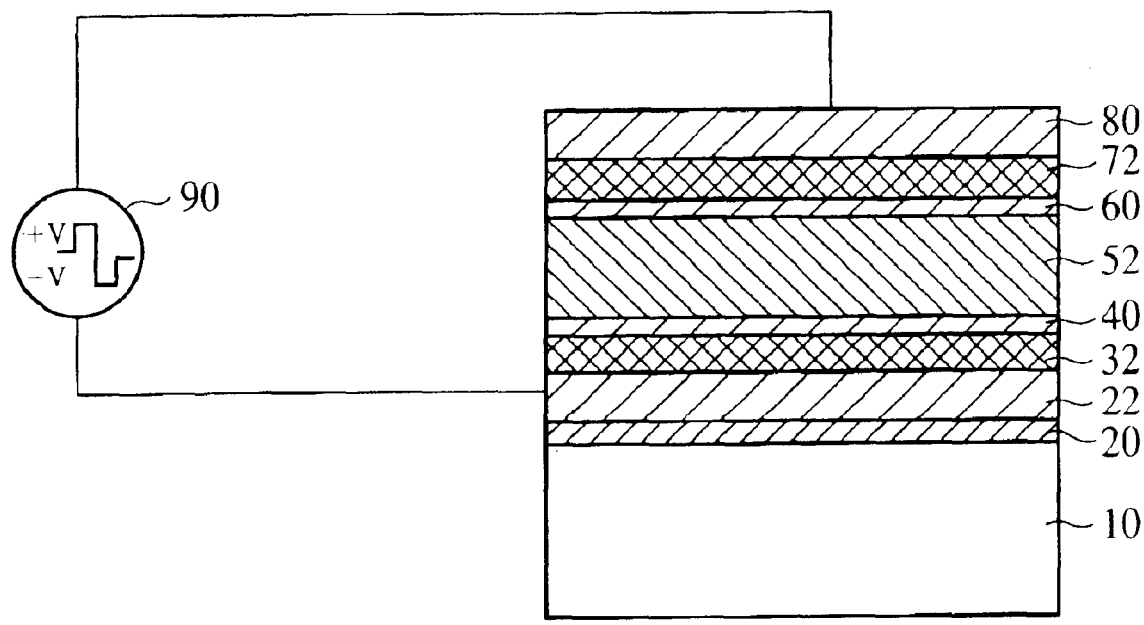
FIG. 7 is a diagrammatic sectional view of the capacitor according to a fourth embodiment of the present invention, which shows a structure thereof.

FIG. 7 is a diagrammatic sectional view of the capacitor according to the present embodiment, which shows the structure thereof.

The capacitor according to the present embodiment is the same in the basic structure as the capacitor according to the third embodiment shown in FIG. 5. The capacitor according to the present embodiment is characterized mainly in that BST films 32, 72 having grain boundaries randomly oriented (hereinafter called a randomly oriented BST film) are formed in place of the (110) (100) BST films 30, 70, and a (111) BST film 52 is formed in place of the (100) BST film 50. The randomly oriented BST film means a film containing all grain boundaries of (100) oriented grain boundaries, and (111) oriented grain boundaries, and (110) oriented grain boundaries. The interface state density of the randomly orientated BST film is low, as is that of the (110) (100) BST film.

In the capacitor according to the present embodiment, the randomly oriented BST films having the low interface state density in the Pt/BST interface are formed respectively in contact with the lower electrode 22 and the upper electrode 80, whereby the leakage characteristics can be improved even in the case that electrons are injected either from the lower electrode 22 or from the upper electrode 80. The dielectric constant of the (111) BST film is higher than that of the (100) BST film. Thus, the capacitor according to the present embodiment can be used effectively in the mode where, as shown in FIG. 7, a power source 90 is connected between the lower electrode 22 and the upper electrode 80 for switching as capacitors of devices requiring high dielectric constants, such as DRAMs and FRAMs.

The capacitor of this structure can increase the storage capacitance by the (111) BST film 52 and improve the leakage current characteristics by the randomly oriented BST films 32, 72. Accordingly the advantage provided by using the (111) oriented film as the capacitor dielectric film and the advantage provided by using the randomly oriented film as the capacitor dielectric film can be concurrently provided. The randomly oriented BST films are provided on the side of the lower electrode 22 and on the side of the upper electrode 80, whereby the capacitor according to the present embodiment is very effective to be used in applications of A.C. drive.

The method for fabricating the capacitor according to the present embodiment is the same as the method for fabricating the capacitor according to the third embodiment except the randomly oriented BST films 32, 72 are formed in place of the (110) (100) BST films 30, 70, and the (111) BST film 52 is formed in place of the (100) BST film 50.

The randomly oriented BST films 32, 72 can be formed by depositing BST films by RF magnetron sputtering, e.g., at a 600° C., a 100 W RF power, a 30/19 $Ar/O_2$ ratio and a 10 mTorr pressure.

The (111) BST film 52 of a (111) oriented polycrystalline BST film having a dielectric constant of about 400 can be formed by depositing by, e.g., RF magnetron sputtering method at a 600° C. substrate temperature, a 100 W RF power, a 30/3.7 $Ar/O_2$ ratio and a 10 mTorr pressure.

As described above, the capacitor according to the present embodiment includes the capacitor dielectric film formed of the randomly oriented film and the (111) oriented film, whereby the capacitor according to the present embodiment can realize both the advantages provided by the randomly oriented film and by the (111) oriented film.

Modifications

The present invention is not limited to the above-described embodiments and can cover other various modifications.

For example, in the above-described embodiments, the capacitor dielectric films are formed of BST films but are not limited to the BST films. Dielectric materials usable in the present invention can be a perovskite-type oxide structure and a compound containing a pyrochlore structure.

The perovskite-type oxide structure are generally represented by $ABO_3$ wherein B is at least one acidic oxide containing a metal from Group IVB, Group VB, Group VIB, Group VIIB, or Group IB of the periodic table, and A represents at least one additional cation having a positive formula charge from about 1 to about 3.

The oxides having pyrochlore structure are generally represented by $A_2B_2O_x$ wherein B is at least one acidic oxide containing a metal from Group IVB, Group VB, Group VIB, Group VIIB, or Group IB of the periodic table, and A is at least one additional cation having a positive formula charge from about 1 to about 3, and x is from about 6 to 7.

Oxides having these structures are, e.g., $BaTiO_x$ (barium titanate), $SrTiO_x$ (strontium titanate), $BaSrTiO_x$ (barium strontium titanate), $BiTiO_x$ (bismuth titanate), $SrBiTaO_x$ (strontium bismuth tantalate), $SrBiNbO_x$ (strontium bismuth niobate), $SrBiTaNbO_x$ (strontium bismuth tantalate niobate), $PbZrTiO_x$ (lead zirconate titanate), $PbLaZrTiO_x$ (lead lanthanum zirconate titanate), $PbMgNbO_x$ (lead magnesium niobate), etc.

The capacitor dielectric film may be formed of 2 or more dielectric materials which are different from each other. In a case that dielectric films are laid directly one on the other, it is difficult to control a film orientation of the film laid upper, and furthermore, leakage current may increase due to reactions between the dielectric films. For example, when (Pb, La) $(Zr, Ti)_3$ (hereinafter called PLZT) and $SrBi_2Ta_2O_9$ (hereinafter called SBT) are laid one on the other, problems are the diffusion of Pb from the PLZT film into the SBT film and the diffusion of Bi from the SBT film to the PLZT film.

Accordingly, in the present invention, the floating electrode is provided between the dielectric films, whereby film orientations of the respective dielectric films can be controlled, and reactions between the dielectric films can be prevented. Different dielectric materials are used, whereby advantages of the respective dielectric films can be utilized.

As diffusion barriers for Pb and Bi, conductive oxide films, such as $IrO_2$ film, etc. are suitable. Accordingly, in a case that different dielectric materials are used, it is preferable to form the floating electrode of a conductive oxide film, such as $IrO_2$ film. For example, the capacitor may have a layer structure of PLZT film/$IrO_2$ film/SBT film. In a case that 2 or more dielectric materials are used, film orientations of the respective dielectric films are not essentially considered.

In the first and the second embodiments, the capacitor dielectric film is formed of 2 films of film orientations different from each other, and in the third and the fourth embodiments, the capacitor dielectric film is formed of 3 films of film orientations different from one another. The capacitor dielectric film may be formed of 4 or more films.

The adhesion layer can be formed of, in addition to a titanium oxide film, a film of a noble metal, alloys of noble metals, alloys of noble metals and non-noble metals, conductive noble metal oxides, insulating metal oxides, insulating metal nitrides or conducting metal nitrides, and combinations, multi-layers or mixtures thereof, such as platinum (Pt), iridium (Ir), zirconium (Zr), titanium (Ti), platinum oxide ($PtO_x$), iridium oxide ($IrO_x$), zirconium oxide ($ZrO_x$), titanium nitride (TiN), TiAlN, tantalum nitride (TaN), TaSiN, etc.

The upper electrode and the lower electrode are formed of, in addition to platinum, transition metals, alloys of transition metals, noble metals, alloys of noble metals and non-noble metals, conductive noble oxides, and combinations, multi-layers or mixtures thereof, such as palladium (Pd), iridium, ruthenium (Ru), rhodium (Rh), rhenium (Re), osmium (Os), platinum oxide, iridium oxide, ruthenium oxide ($RuO_x$), gold (Au), silver (Ag), copper (Cu), etc.

The floating electrode is formed of, in addition to platinum, transition metals, alloys of transition metals, noble metals, alloys of noble metals, alloys of noble metals and non-noble metals, conductive noble oxides, conductive metal nitrides, and combinations, multi-layers or mixtures thereof, such as palladium, iridium, ruthenium, rhodium, rhenium osmium, platinum oxide, iridium oxide, ruthenium oxide, gold, silver, copper, TiAlN, TaSiN, etc.

In the above-described embodiments, the capacitor dielectric film is formed by RF magnetron sputtering but may be formed by chemical solution deposition, physical vapor deposition, chemical vapor deposition or others. Also in these depositions, film orientations of the deposited films can be controlled by suitably adjusting deposition conditions.

The film thickness and the film orientation of the respective high dielectric constant films forming the capacitor dielectric film is not limited to those described in the above-described embodiments, and for example, (100) oriented film, (110) oriented film, (111) oriented film, (110) (100) oriented film, (100) (111) oriented film, (110) (111) oriented film and randomly oriented film can be arbitrarily combined to thereby form the capacitor dielectric film having required characteristics. It is preferable that the capacitor dielectric film is suitably selected in accordance with characteristics required by devices the capacitor is applied to.

The film orientation dependency of characteristics of the capacitor dielectric film is much varied depending on dielectric materials, film forming processes, grain sizes, etc., and it is not generally said which oriented films are suitably used in applications. The inventors of the present invention formed the dielectric films by the RF magnetron sputtering system used in the above-described embodiments and has obtained the following result. As for BST film, the (111) oriented film can provide large dielectric constant, the (100) oriented film can provide the capacitance value which is highly tunable depending on the voltage, the randomly oriented film and the (110) (100) oriented film can provide high leakage resistance, and the (111) oriented film can provide high resistance to hydrogen. As for PZT, the (001) oriented film and the (111) oriented film can provide large residual polarization capacity, and the (100) oriented film and the (001) oriented film can provide high leakage characteristics.

What is claimed is:

1. A capacitor comprising;
a lower electrode;
a capacitor dielectric film formed on the lower electrode and including at least two dielectric films whose film crystallographic orientations are different from each other and which are spaced from each other by a floating electrode; and
an upper electrode formed on the capacitor dielectric film.

2. A capacitor comprising:
a lower electrode;
a first dielectric film formed on the lower electrode;
a first floating electrode formed on the first dielectric film;
a second dielectric film formed on the first floating electrode and having a film crystallographic orientation different from that of the first dielectric film; and
an upper electrode formed on the second dielectric film.

3. A capacitor according to claim 2, wherein
an interface state density in an interface between the first dielectric film and the lower electrode is lower than that in an interface between the second dielectric film and a film formed of a material forming the lower electrode if the second dielectric film is formed on the film.

4. A capacitor according to claim 2, wherein
a dielectric material forming the first dielectric film and a dielectric material forming the second dielectric film are different from each other.

5. A capacitor according to claim 2, further comprising:
a second floating electrode formed on the second dielectric film; and
a third dielectric, film formed on the second floating electrode and having a film orientation different from that of the second dielectric film.

6. A capacitor according to claim 5, wherein
an interface state density in an interface between the third dielectric film and the upper electrode is lower than that in an interface between the second dielectric film and a film formed of a material forming the upper electrode if the second dielectric film is formed on the film.

7. A capacitor according to claim 5, wherein
a dielectric material forming the first dielectric film and a dielectric material forming the third dielectric film are the same.

8. A capacitor according to claim 5, wherein
a film orientation of the first dielectric film is substantially the same as that of the third dielectric film.

9. A capacitor according to claim 6, wherein
a dielectric material forming the second dielectric film and a dielectric material forming the third dielectric film are different from each other.

10. A capacitor according to claim 2, wherein
the first and the second dielectric films are formed of oxide dielectric films having a crystal structure of perovskite structure or pyrochlore structure.

11. A capacitor according to claim 10, wherein
the first and the second dielectric films are formed of materials selected from a group consisting of $BaTiO_x$, $SrTiO_x$, $BaSrTiO_x$, $BiTiO_x$, $SrBiTaO_x$, $SrBiNbO_x$, $SrBiTaNbO_x$, $PbZrTiO_x$, $PbLaZrTiO_x$, and $PbMgNbO_x$.

12. A capacitor according to claim 5, wherein
the third dielectric film is formed of an oxide dielectric film having a crystal structure of perovskite structure or pyrochlore structure.

13. A capacitor according to claim 12, wherein
the third dielectric film is formed of a material selected from a group consisting of $BaTiO_x$, $SrTiO_x$, $BaSrTiO_x$, $BiTiO_x$, $SrBiTaO_x$, $SrBiNbO_x$, $SrBiTaNbO_x$, $PbZrTiO_x$, $PbLaZrTiO_x$, and $PbMgNbO_x$.

* * * * *